United States Patent [19]
Arai

[11] Patent Number: 5,632,617
[45] Date of Patent: May 27, 1997

[54] CURING APPARATUS

[75] Inventor: Mitsuo Arai, Oume, Japan

[73] Assignee: Kabushiki Kaisha Shinkawa, Tokyo, Japan

[21] Appl. No.: 561,401

[22] Filed: Nov. 21, 1995

[30] Foreign Application Priority Data

Nov. 25, 1994 [JP] Japan ................................. 6-314281

[51] Int. Cl.⁶ .............................................. F27B 9/00
[52] U.S. Cl. .............................................. 432/147
[58] Field of Search ........................... 432/143, 147, 432/148, 202; 392/435

[56] References Cited

U.S. PATENT DOCUMENTS 3,374,995  3/1968  Cook ........................ 432/147
4,310,745  1/1982  Bender ..................... 392/435
5,154,604  10/1992 Arai .
5,267,853  12/1993 Arai .

FOREIGN PATENT DOCUMENTS 6-19546  5/1994  Japan .

*Primary Examiner*—Noah P. Kamen
*Attorney, Agent, or Firm*—Koda and Androlia

[57]  ABSTRACT

A curing apparatus for drying bonding material that is used for bonding, for example, chips to a lead frame for semiconductor devices including a plurality of heating blocks which are spacedly installed in a conveying direction of workpieces and each of the heating blocks is provided with heat-insulating plates on its lower surface, both side surfaces and both end surfaces so as to facilitate temperature control of each of the heating blocks.

3 Claims, 9 Drawing Sheets

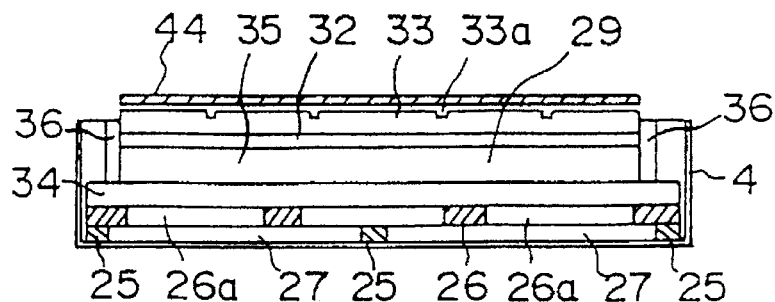
FIG. 7
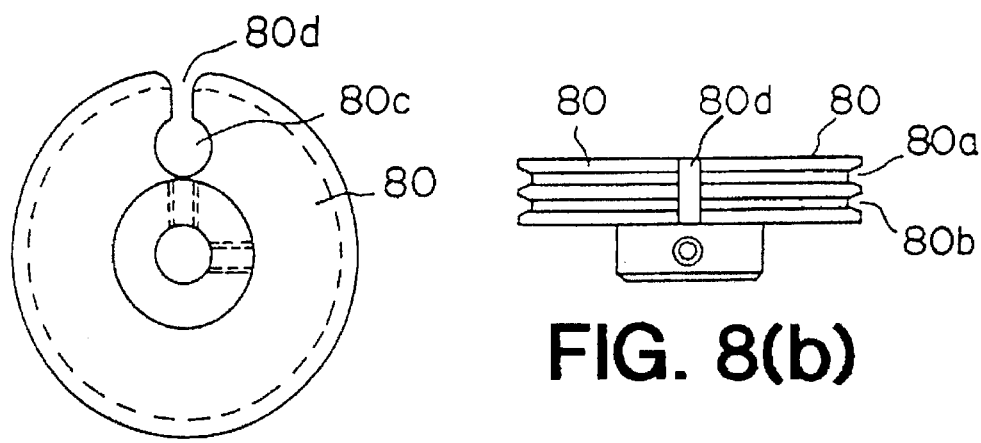
FIG. 8(a)
FIG. 8(b)
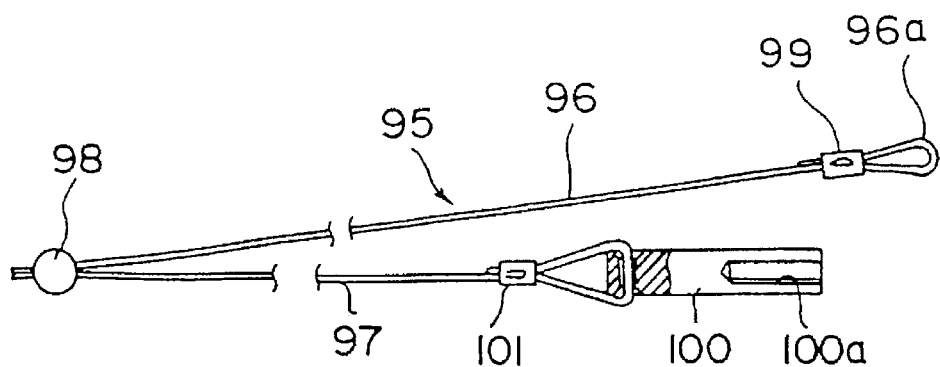
FIG. 9

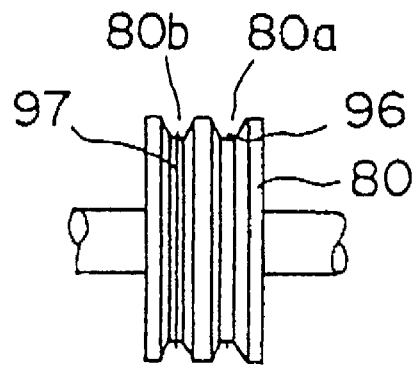
FIG. 12
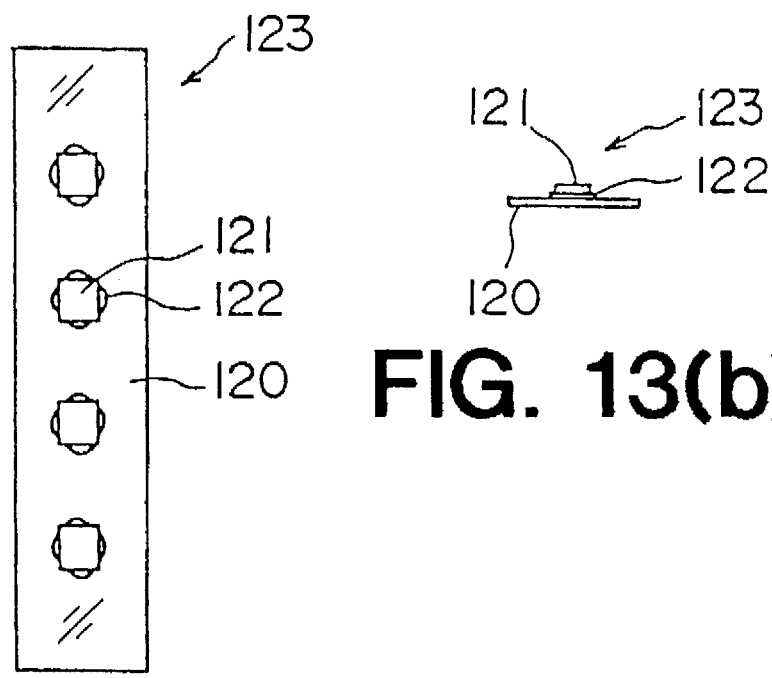
FIG. 13(b)
FIG. 13(a)

CURING APPARATUS

BACKGROUND OF THE INVENTION

1. Field of the Invention

The present invention relates to a curing apparatus which dries the paste on workpieces in which chips are bonded to lead flames by the paste.

2. Prior Art

Examples of conventional curing apparatuses include the curing apparatuses described in Japanese Utility Model Application Publication (Kokoku) No. 6-19546, Japanese Patent Application Laid-Open (Kokai) Nos. 4-5838 and 5-109792, etc.

In these curing apparatuses, a plurality of prismatic heating blocks which heat the workpieces are installed at equal intervals along the conveying direction of the workpieces. Japanese Utility Model Application Publication (Kokoku) No. 6-19546 further discloses the respective heating blocks heated in stages from the workpiece entry point toward the workpiece exit point; accordingly, the temperatures of the respective heating blocks are independently controlled. For example, if eight heating blocks are employed, the first three heating blocks (counting from the workpiece entry side) are controlled to a temperature of 250° C., the next two heating blocks are controlled to a temperature of 270° C., and the remaining three heating blocks are controlled to a temperature of 250° C.

In the prior art described above, a plurality of heating blocks are merely installed at equal intervals, and no consideration is given to the fact that adjacent heating blocks affect each other in terms of heat. As a result, temperature control of the respective heating blocks is difficult, and reliable temperature control is impossible.

SUMMARY OF THE INVENTION

Accordingly, the object of the present invention is to provide a curing apparatus which controls the temperatures of the respective heating blocks reliably and easily.

The object of the present invention is accomplished by a unique structure for a curing apparatus in which a plurality of heating blocks are installed, with gaps or spaces in between, in the conveying direction of workpieces in which chips are bonded to lead frames by means of a paste so as to heat the workpieces. The unique structure of the present invention is that respective heat-insulating plates are provided on the lower surface with both side surfaces oriented in the conveying direction of the workpieces and both end surfaces oriented perpendicular to the conveying direction of the workpieces of the main body of each of the blocks.

Since the periphery of the main body of each heating block except for the upper surface is covered by heat-insulating plates, each heating block is not affected by the heat from the adjacent heating blocks, and therefore, temperature control of each heating block can be accomplished accurately and easily.

BRIEF DESCRIPTION OF THE DRAWINGS

FIG. 7 shows a vertical cross section of the workpiece heating chamber casing taken along the line 7—7 in FIG. 5;

FIG. 8 Shows a drive pulley used in the curing apparatus of the present invention, wherein FIG. 8($a$) is a front view thereof, and FIG. 8($b$) is a top view thereof;

FIG. 9 is a front view of the wire rope used in the curing apparatus of the present invention;

FIG. 12 shows the drive pulley viewed in the direction of arrow C in FIG. 11; and FIG. 13 illustrates an example of a workpiece worked by the curing apparatus of the present invention, wherein FIG. 13($a$) is a top view of the workpiece, and FIG. 13($b$) is a front view of the workpiece.

DETAILED DESCRIPTION OF THE INVENTION

One embodiment of the present invention will be described below with reference to FIGS. 1 through 13.

Figure 1:
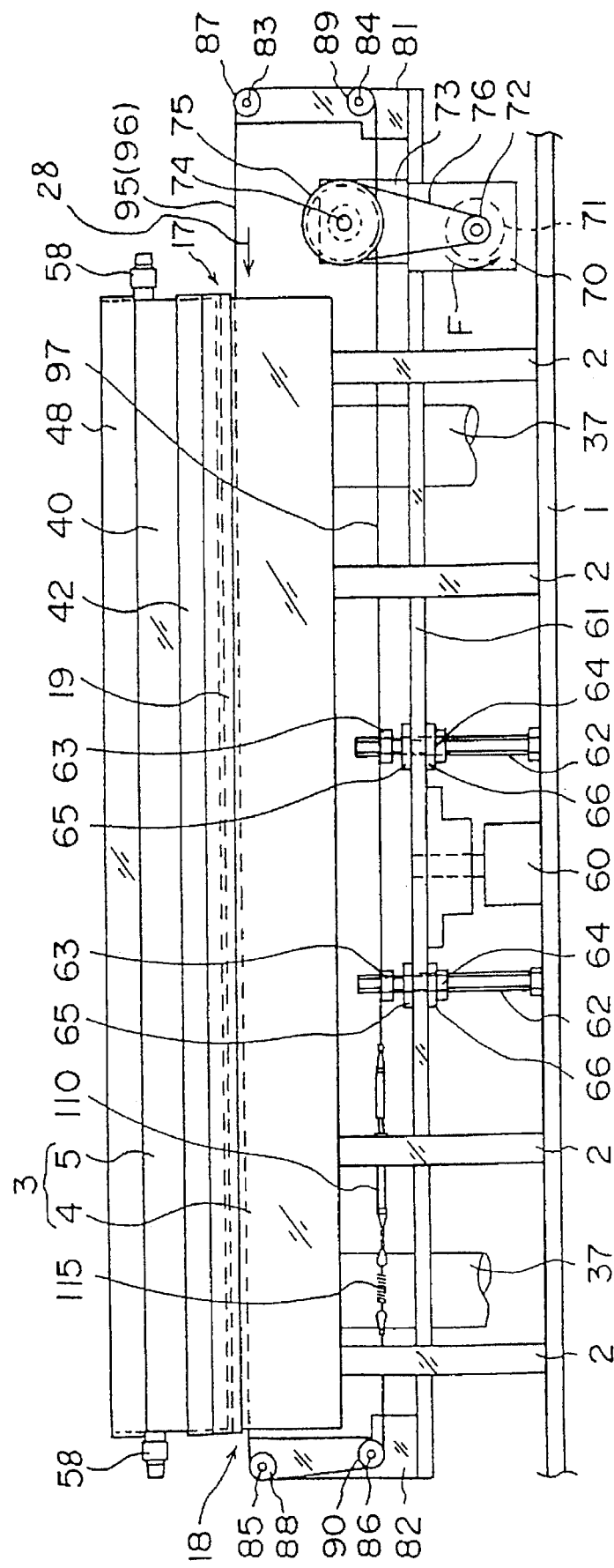
FIG. 1 is a front view of one embodiment of the curing apparatus according to the present invention.
Figure 2:
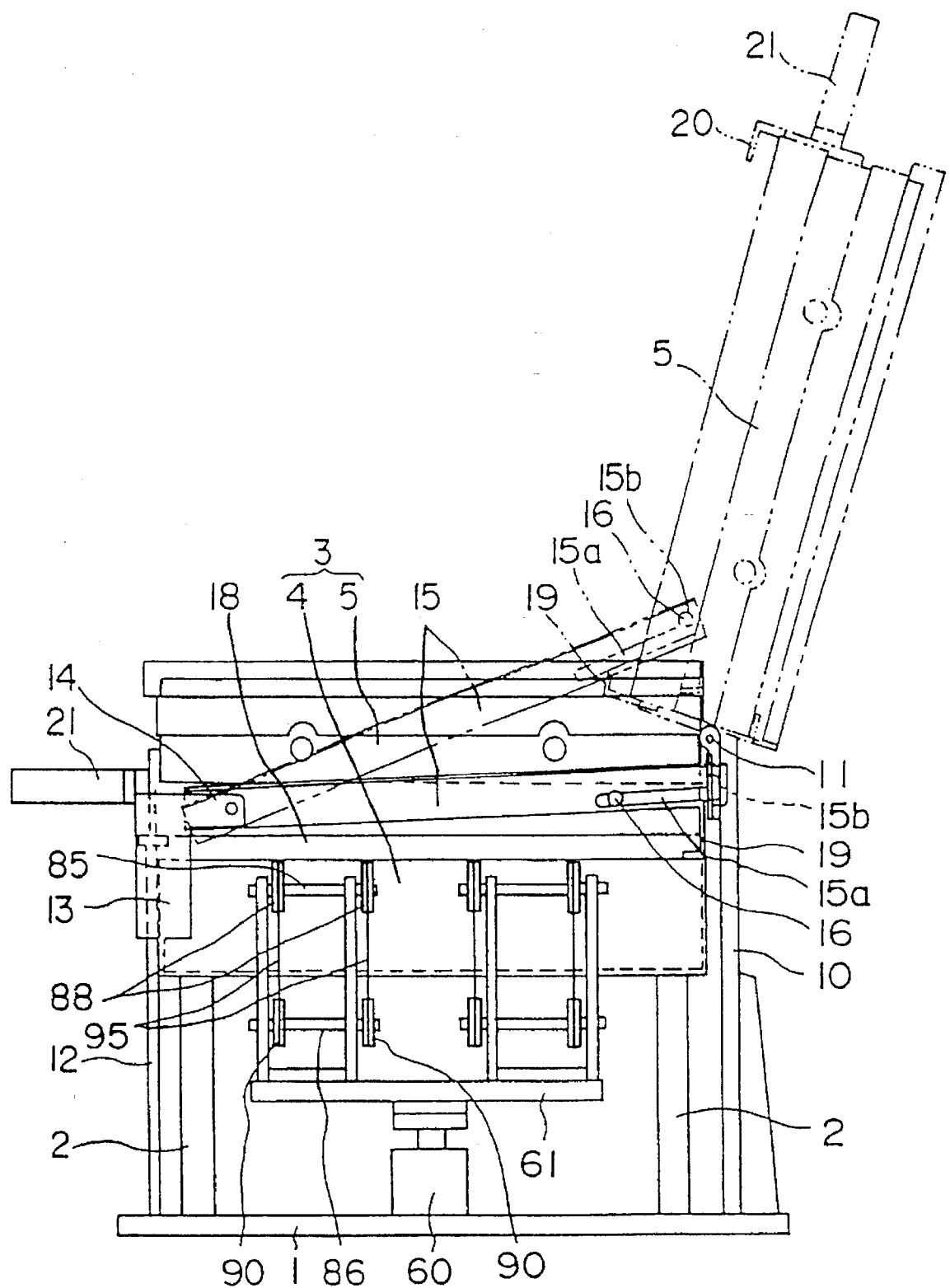
FIG. 2 is a left-side view thereof.

As shown in FIGS. 1 and 2, a casing 3 is provided on base stand 1 via a plurality of supporting columns 2 which are erected on the base stand 1. The casing 3 consists of a workpiece heating chamber casing 4, which is secured to the supporting columns 2, and a gas supply chamber casing 5, which freely opens and closes with respect to the workpiece heating chamber casing 4.

The open-and-close structure of the gas supply chamber casing 5 will be described with reference to FIG. 2.

Supporting columns 10 which support the gas supply chamber casing 5 are vertically provided on both ends (right and left ends when viewed in FIG. 1) of the front side (fight side in FIG. 2) of the base stand 1, and pins 11 are fastened to the top ends of the supporting columns 10. The supporting columns 10 are parallel to the front side of the workpiece heating chamber casing 4. The front side of the gas supply chamber casing 5 is rotatably connected to the pins 11 so that the gas supply chamber casing 5 is free to change its position from the solid line (closed) position to the two-dotted line (opened) position in FIG. 2.

Furthermore, supporting plates 12 (only one shown in FIG. 2) are fastened to both ends (right and left ends when viewed in FIG. 1) of the rear side of the base stand 1, and L-shaped supporting plates 13 (only one shown) are fastened to the supporting plates 12 so that the L-shaped supporting plates 13 are positioned on both side portions of the gas supply chamber casing 5 when the casing 5 is in a closed position as indicated by the solid lines in the FIG. 2. Pins 14 (only one shown) are fastened to one end of each of these L-shaped supporting plates 13, and one end of each of locking levers 15 (only one shown) is connected at one end thereof to the pins 14 so that the locking levers 15 are rotatable about the pins 14. An elongated groove 15$a$ and a locking groove 15$b$ are formed continuously in the opposite end of each of the locking levers 15. The elongated groove 15$a$ extends at fight angles in the direction of the length of the locking lever 15, and the locking groove 15$b$ extends upward from one end (or the front end which is on the fight side in FIG. 2) of the elongated groove 15a. Pins 16 fastened to the side surfaces of the gas supply chamber casing 5 are engaged with these grooves 15a and 15b.

A front cover 19 and a rear cover 20 are fastened to the front and rear ends of the gas supply chamber casing 5 so that when the gas supply chamber casing 5 is closed, the from and rear ends of the gas supply chamber casing 5 come into contact with the front and rear edges of the workpiece heating chamber casing 4 and so that a workpiece entry port 17 and a workpiece exit port 18 are formed at one end (fight end in FIG. 4) of the casing 5 and at another end (left end in FIG. 4) of the casing 5, respectively. The gas supply chamber casing 5 is further provided with a handle 21 on the rear side thereof, the handle 21 being used when the casing 5 is opened and closed.

With the above structure, if the handle 21 is lifted upward from the position indicated by the solid lines in FIG. 2, the gas supply chamber casing 5 is pivoted about the pins 11 and shifted into the open position which is shown by the two-dot chain line. Thus, the upper area of the workpiece heating chamber casing 4 is uncovered.

When the gas supply chamber casing 5 is opened, the pins 16 fastened to the gas supply chamber casing 5 are moved in the elongated grooves 15a; and when the pins 16 reach the locking grooves 15b and are engaged therewith, the gas supply chamber casing 5 is restricted from opening further, and the pins 16 engaged with the locking grooves 15b can keep the gas supply chamber casing 5 opened by the locking levers 15.

In order to close the gas supply chamber casing 5, the tip end portions of the locking levers 15 are pushed slightly upward. This causes the pins 16 to disengage from the locking grooves 15b and move into the elongated grooves 15a. Then, the handle 21 is brought downwardly until the front cover 19 and rear cover 20 make tight contact with the workpiece heating chamber casing 4. The gas supply chamber casing 5 can thus be securely closed.

The structure inside the workpiece heating chamber casing 4 will be described particularly with reference to FIGS. 4, 5 and 7.

Three long, slender spacers 25a, 25b and 25c are, as best seen in FIG. 7, provided on the bottom surface inside the workpiece heating chamber casing 4 so that they are at the front, center and rear positions inside the casing 4, respectively, and extend from near the workpiece entry port 17 to near the workpiece exit port 18. In addition, a single heating block supporting plate 26 is provided on the upper surfaces of these spacers 25 and spaces 27 are formed between the heating block supporting plate 26 and the bottom surface of the workpiece heating chamber casing 4.

Figure 4:
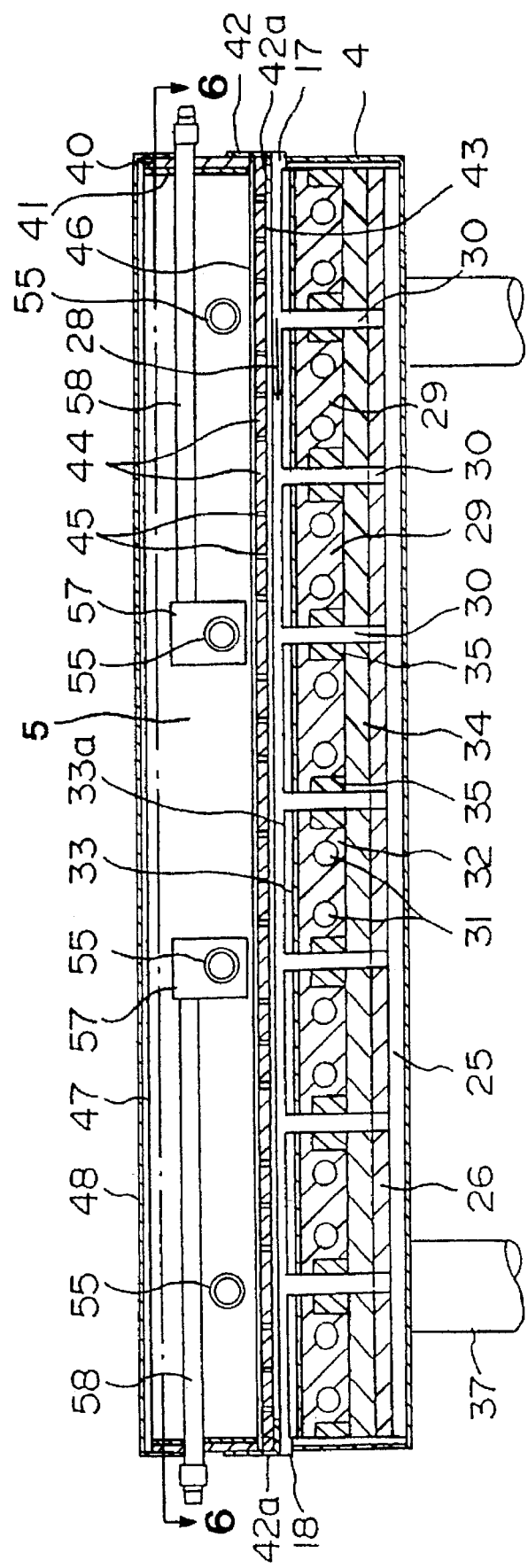
FIG. 4 is a vertical cross section of the casings used in the curing apparatus of FIG. 1.
Figure 5:
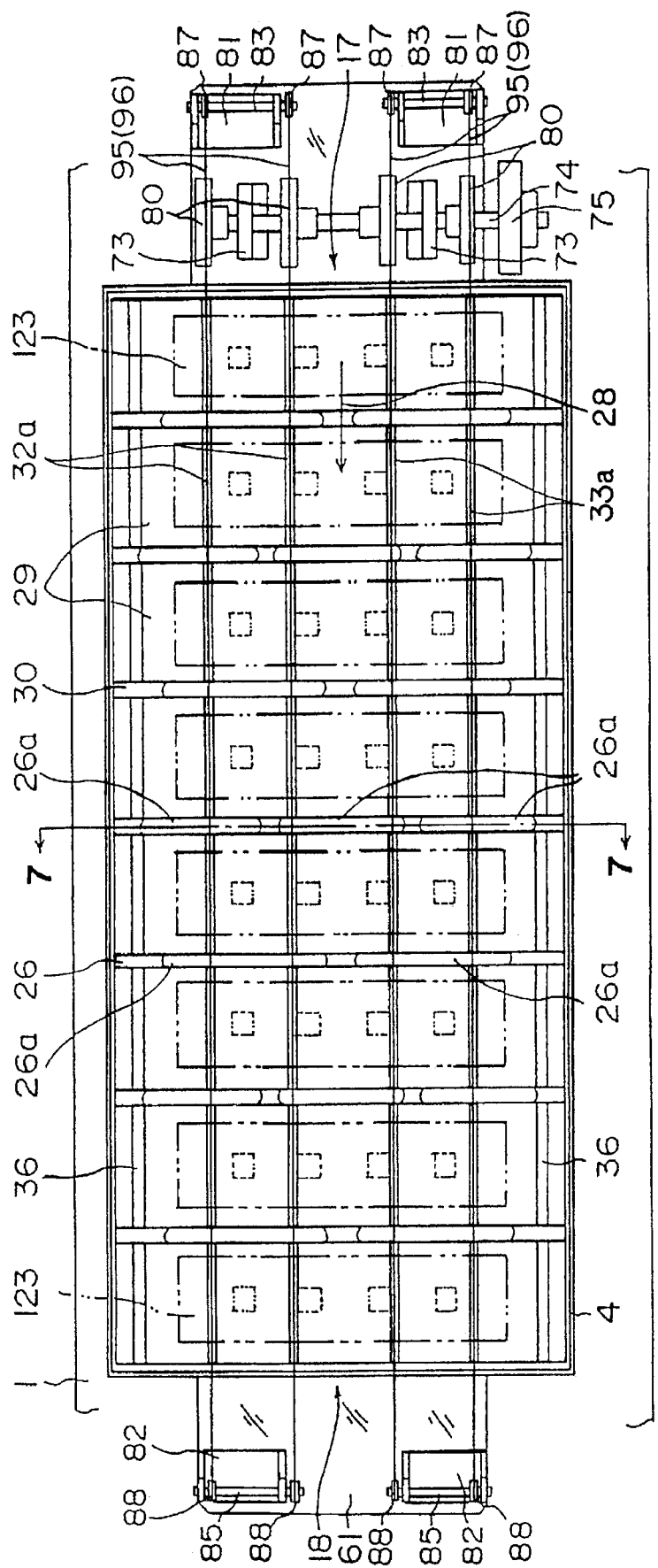
FIG. 5 is a top view of the workpiece heating chamber casing and workpiece conveying means of the curing apparatus of FIG. 1.

A plurality of heating blocks 29 (eight heating blocks in this embodiment as shown in FIGS. 4 and 5) are disposed parallel to each other on the heating block supporting plate 26. They are placed side by side in the direction in which the workpiece is conveyed as shown by arrow 28. In other words, the heating blocks 29 are installed in a direction from the workpiece entry port 17 to the workpiece exit port 18 with gaps 30 left between the heating blocks 29.

The heating block supporting plate 26 described above is provided with a plurality of elongated slots 26a so that the gaps 30 between the heating blocks 29 communicate with the spaces 27 which are formed under the supporting plate 26.

Each of the heating blocks 29 includes a heating block main body 32 that has two heaters 31 embedded therein and a hot plate 33 fastened to the top surface thereof. In addition, adiabatic plates 34, 35 and 36 are attached to the heating block main body 32. In particular, the bottom adiabatic plate 34 is fastened to the undersurface of the heating block main body 32, two side adiabatic plates 35 are fastened to both side surfaces of the heating block main body 32 so that they are oriented in the workpiece conveying direction 28, and the other two adiabatic plates 36 are fastened to both side surfaces (or front and rear surfaces) of the heating block main body 32 so that they are oriented in the direction perpendicular to the workpiece conveying direction 28. In addition, as best seen in FIG. 7, a plurality of feed wire grooves 33a (four feed wire grooves in this embodiment) are formed in the upper surface of each hot plate 33 so that they extend in the workpiece conveying direction 28.

The workpiece heating chamber casing 4 is further provided with gas discharge pipes 37. The gas discharge pipes 37 open into the spaces 27 which are located under the heat block supporting plate 26.

In the described embodiment, the heating blocks 32 and the hot plates 33 are made of stainless steel; and for the adiabatic plates 34, 35 and 36, the plates called "NIKOLYTE" (trademark), made by Nikko Kasei Kabushiki Kaisha, are used.

The structure of the gas supply chamber casing 5 will be described next with reference to FIGS. 4 and 6.

The gas supply chamber casing 5 is comprised of a rectangular main frame 40, a lower cover 42 and a top cover 48.

Figure 6:
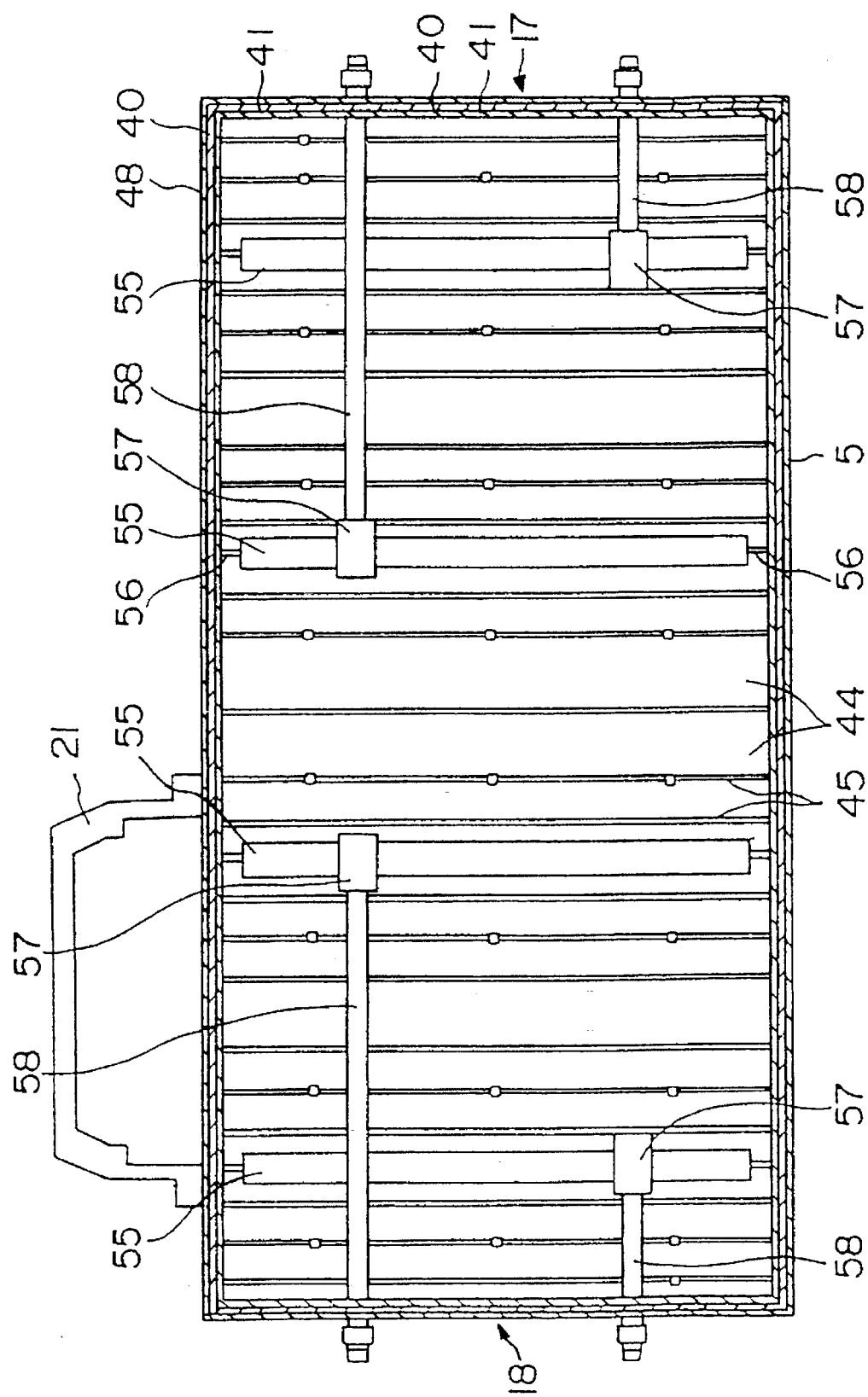
FIG. 6 is a horizontal cross section taken along the line 6—6 in FIG. 4.

The main frame 40 is open at the top and bottom, and as best seen in FIG. 6, adiabatic plates 41 are attached to the entire inner surface of the main frame 40.

The lower cover 42, as seen from FIG. 4, has a flange part 42a and is attached to the lower open area of the main frame 40, and gas supply slit forming plates 44 made of heat-resistant transparent glass are fastened to the flange part 42a of the lower cover 42 with rubber packing 43 in between. The slit forming plates 44 are disposed parallel to each other in a row in the workpiece conveying direction 28 so that gas supply slits 45 are formed between the slit forming plates 44. The gas supply slits 45 positionally correspond to the heating blocks 29. In other words, the slit forming plates 44 are disposed so that the gas supply slits 45 formed between them are located above the heating blocks 29 and face them as best seen in FIG. 4. The lower cover 42 to which the slit forming plates 44 are disposed is fastened to the main frame 40 with a rubber packing 46 in between.

The top cover 48 is transparent and is fastened to the main frame 40 with a rubber packing 47 in between, thus covering the upper open area of the main frame 40.

Next, the structure of a gas supplying means which supplies gas to the interior of the gas supply chamber casing 5 will be described.

As best shown in FIG. 6, four (4) gas emitting pipes 55, each of them being closed at both ends, are installed inside the gas supply chamber casing 5 by supporting shafts 56 These supporting shafts 56 are secured to both ends of each gas emitting pipe 55 and also to the main frame 40 of the chamber casing 5 with the adiabatic plate 41 in between. Gas emitting holes (not shown) are opened in each of the gas emitting pipes 55. A connecting block 57 is fastened to each of the gas emitting pipes 55 so that the connecting block 57 communicates with the pipe 55, and one end of each of heater-equipped gas introduction pipes 58 which are fastened to the main frame 40 is connected to each of the connecting blocks 57.

As seen from FIG. 6, the gas introduction pipes 58 for the gas emitting pipes 55 which are provided closer to the workpiece entry port 17 (or located in the right side half in FIG. 6) extend toward the workpiece entry port 17, and the gas introduction pipes 58 for the gas emitting pipes 55 which are provided closer to the workpiece exit port 18 (or located in the left side half in FIG. 6) extend toward the workpiece exit port 18.

A gas supply source (not shown) is connected to the gas introduction pipes 58, and gas transfer holes (not shown) are formed between the connecting blocks 57 and the gas emitting pipes 55 so that the gas is supplied from the gas introduction pipes 58 into the gas emitting pipes 55 through the gas transfer holes.

Next, the workpiece conveying means will be described with reference to FIGS. 1 through 3 and FIG. 5.

An air cylinder 60 is mounted on the base stand I so that it is beneath roughly the center of the workpiece heating chamber casing 4, and a vertically movable plate 61 is fastened to the operating rod of the air cylinder 60.

Upright bolts 62 are installed on the base stand 1, and the movable plate 61 is fitted loosely over the upright bolts 62. Upper-limit stopper nuts 63 and lower-limit stopper nuts 64 are screwed to these upright bolts 62 so that they are located above and below the movable plate 61.

Furthermore, upper and lower stopper cushions 65 and 66 are fitted loosely on the upright bolts 62. The upper stopper cushions 65 are disposed between the movable plate 61 and the upper-limit stopper nuts 63, and the lower stopper cushions 66 are disposed between the movable plate 61 and the lower-limit stopper nuts 64.

The movable plate 61 is provided with a bracket 70 at one end near the workpiece entry port 17, and a drive motor 71 is mounted on this bracket 70. A timing pulley 72 is coupled to the output shaft of the drive motor 71. The movable plate 61 is further provided with, as best seen in FIG. 5, a plurality of shaft supporting plates 73 on the upper surface thereof so that they are located near the workpiece entry port 17, and a drive shaft 74 is rotatably supported on the shaft supporting plates 73. A timing pulley 75 is fastened to one end of the drive shaft 74, and a timing belt 76 is installed between this timing pulley 75 and the timing pulley 72 of the output shaft of the drive motor 71.

Reciprocatory motion drive pulleys 80 (four drive pulleys 80 in this embodiment) are mounted on the drive shaft 74 so that they positionally correspond to the feed wire grooves 33a of the hot plates 33.

FIG. 8 shows one of the drive pulleys 80. As seen from FIG. 8(b), the drive pulley 80 has two pulley grooves, a first pulley groove 80a and a second pulley groove 80b. A circular stopping hole 80c is, as shown in FIG. 8(a), formed in the drive pulley 80 so as to extend parallel to the axis of the pulley 80, and a rope insertion groove 80d extends radially from one edge of the stopping hole 80c toward the circumference of the pulley 80.

Figure 3:
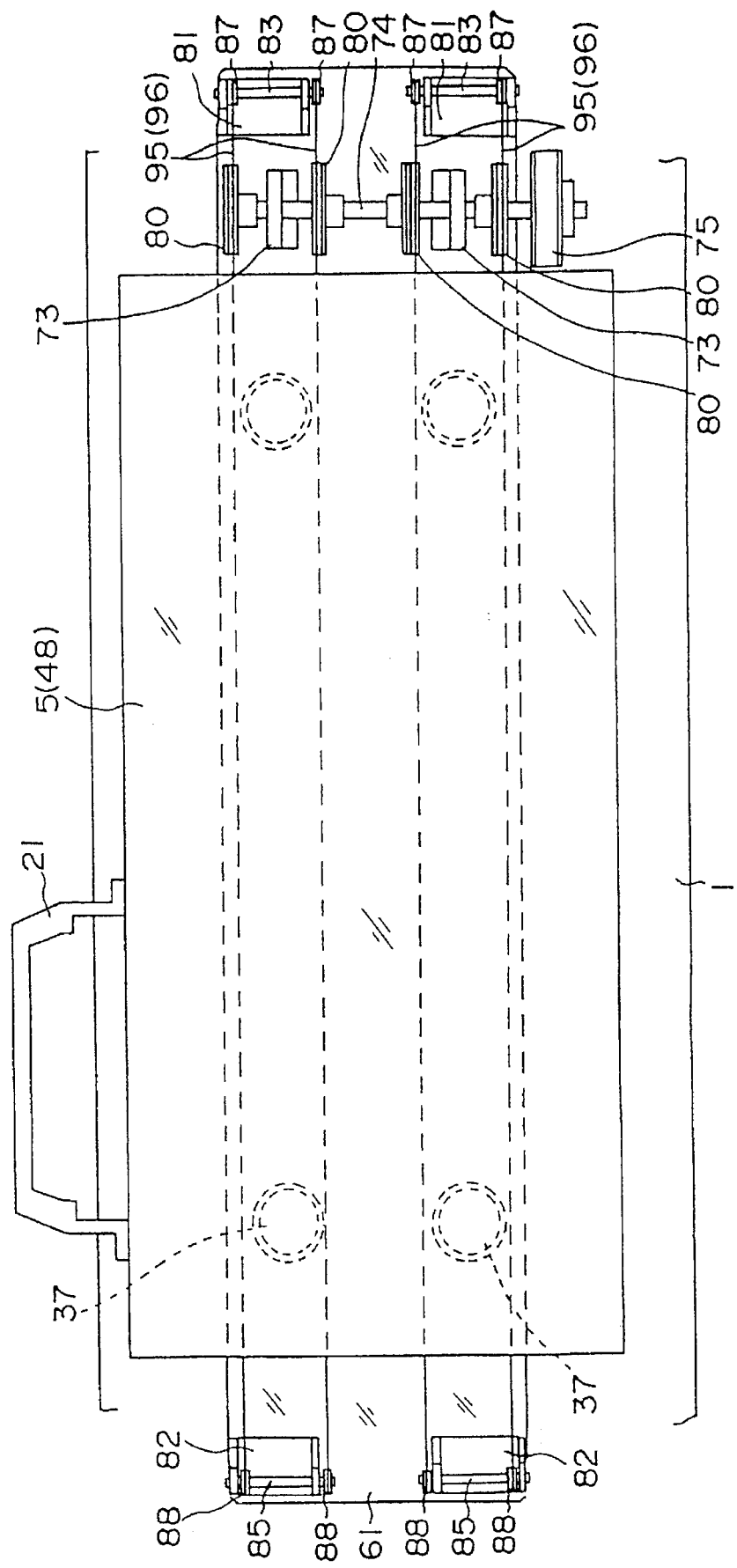
FIG. 3 is a top view thereof.

Returning now to FIGS. 1 and 5, feeding pulley supporting plates 81 and 82 are disposed on the upper surface of the movable plate 61. As best seen in FIG. 3, the feeding pulley supporting plates 81 are provided at one end of the movable plate 61 so as to be outside the drive shaft supporting plates 73 and near the workpiece entering port 17, and the feeding pulley supporting plates 82 are provided at another end of the movable plate 61 and near the workpiece exit port 18.

Four pairs of feeding pulley shafts 83, 84, 85 and 86 are rotatably provided on the feeding pulley supporting plates 81 and 82 as seen from FIGS. 1 and 5. The shafts 83 and 85 are disposed above the shafts 84 and 86, respectively, as best seen in FIG. 1.

As shown in FIG. 3, two feeding pulleys 87 are attached to both ends of each one of the pair of feeding pulley shafts 83, and two feeding pulleys 88 are attached to both ends of each one of the pair of feeding pulley shafts 85. Likewise, two feeding pulleys 89 are attached to both ends of each one of the pair of feeding pulley shafts 84, and two feeding pulleys 90 are attached to both ends of each one of the pair of feeding pulley shafts 86. The feeding pulleys 89 and 90 are disposed so that they positionally correspond to or are vertically below the pulleys 87 and 88.

As seen from FIG. 5, the feeding pulleys 87 and 88 are positioned so that grooves (not shown) of these pulleys are on imaginary lines extending from the feed wire grooves 33a of the hot plates 33.

Feeding wire ropes 95 of the type shown in FIG. 9 are installed on the reciprocatory motion drive pulleys 80 and feeding pulleys 87 through 90. Both ends of each feeding wire rope 95 are joined by a joint 110 of the type shown in FIG. 10 so as to make a loop as shown in FIG. 11.

More specifically, the feeding wire rope 95, as shown in FIG. 9, comprises two rope elements: a first rope element 96 and a second rope element 97. One end of each of the rope elements 96 and 97 is passed through and secured to a ball-form end fitting 98 so as to make a single unit, forming the feeding wire rope 95. The end fitting 98 is a ball and designed so as to be larger in diameter than the stopping hole 80c of the drive pulley 80. The other end of the first rope element 96 is folded back and fastened by a fastener 99 so as to form a connecting loop 96a. The other end of the second rope element 97 is passed through a connecting piece 100, folded back and then fastened to it by a fastener 101. The connecting piece 100 is formed with a fight-handed screw 100a therein.

Figure 10:
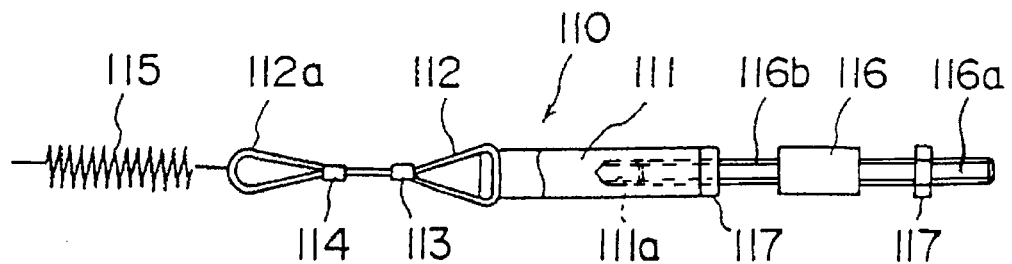
FIG. 10 is a front view of a joint for joining the ends of the wire rope.
Figure 11:
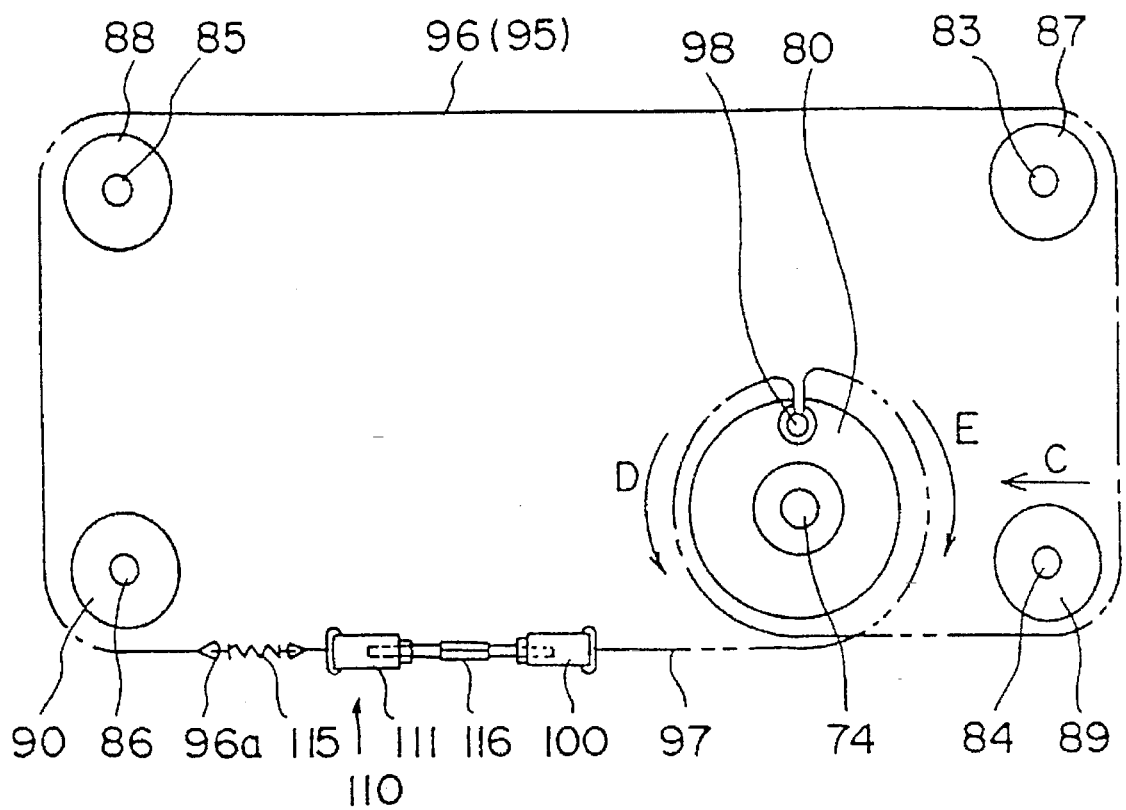
FIG. 11 is an explanatory diagram showing the installation of the wire rope around the pulleys used in the curing apparatus of the present invention.

Furthermore, as seen from FIG. 10, the joint 110 includes a connecting assembly 111 which has roughly the same structure as the connecting piece 100, and a left-handed screw 111a which is threaded in the opposite direction from the fight-hand screw 100a of the connecting piece 100 is formed in the connecting assembly 111. A wire 112 is passed through the end of the connecting assembly 100. One end of the wire 112 is connected to the connecting assembly 100 by a fastener 113, and the other end of the wire 112 is folded back and fastened to a fastener 114 to make a connecting loop 112a. A tension coil 115 is connected to this loop 112a of the wire 112 at one end thereof and the other end of the tension coil 115 is connected to the connecting loop 96a of the wire rope 95 so that the wire rope 95 makes a loop as shown in FIG. 11.

The joint 110 further includes an adjustment bolt 116 which connects the connecting piece 100 and the connecting assembly 111 together. In particular, the adjustment bolt 116 includes a fight-handed screw 116a that engages with the right-handed screw 100a of the connecting piece 100 and a left-handed screw 116b that engages with the left-handed screw 111a of the connecting assembly 111. In FIG. 10, the reference numeral 117 indicates a nut that prevents loosening.

The installation of the wire ropes 95 on the pulleys will be described with reference to FIGS. 9 through 11. Four wire ropes 95 are used in this embodiment as seen from FIG. 5, but the description will be made below for only one wire rope installation since the installations of all wire ropes 95 are done in the same way.

(1) The first and second rope elements 96 and 97 are put on top of each other, and they are inserted into the stopping hole 80c of the drive pulley 80 through the rope insertion groove 80d. The end fitting 98 of the feeding wire rope 95 is positioned outside the drive pulley 80. Since the end fitting 98 is larger than the stopping hole 80c of the pulley 80, the feeding wire rope 95 is prevented by this end fitting 98 from slipping out of the pulley 80.

(2) The first rope element 96 is turned 180 degrees in the counterclockwise direction (i.e., the direction indicated by arrow D) in the first pulley groove 80a of the drive pulley 80 and then installed on the feeding pulleys 89, 87, 88 and 90 in this order. The connecting loop 96a at the end of the first rope element 96 is connected to the tension coil spring 115 of the joint 110.

(3) The second rope element 97 is turned 180 degrees in the clockwise direction (i.e., the direction indicated by arrow E) in the second pulley groove 80b of the drive pulley 80, and the connecting assembly 100 at the end of the second wire element 97 is screw-engaged with the right-handed screw 116a of the adjustment bolt 116 of the joint 110.

(4) The adjustment bolt 116 is turned so that an appropriate tension is applied to the tension coil spring 115, eliminating any slack in the first and second rope elements 96 and 97.

By the steps described above, the feeding wire rope 95 is installed on the drive and feeding pulleys, so that a part of the rope element 96 is located between the pulleys 87 and 88 and positionally corresponds to the feeding wire grooves 33a of the hot plates 33.

The other three wire ropes 95 are installed in the same way as described above so that all four wire ropes 95 are set to be parallel to each other as shown in FIG. 5.

The operation of the curing apparatus constructed as above will be described. FIG. 13 shows an example of the workpiece treated by the curing apparatus. This workpiece 123 is a lead frame 120 on which chips 121 are die-bonded by a paste 122 which is silver, solder, etc.

1. First, the workpiece 123 is fed in the lengthwise direction from a die bonder (not shown) onto the end portions (fight-end portions) of the first rope elements 96 of the conveying means.

At this point, the first rope elements 96 are positioned above the feed wire grooves 33a of the hot plates 33. In other words, the operating rod of the air cylinder 60 is extended so that the movable plate 61 is in a raised position. Since the pulley supporting plates 81 and 82 that include the feeding pulleys 87, 89, 88 and 90 are mounted on the movable plate 61, the wire ropes 95 are in a raised position together with the movable plate 61.

2. Next, the drive motor 71 is actuated by a fixed amount in the counterclockwise direction (i.e., in the direction indicated by arrow F) in FIG. 1. As a result, the drive shaft 74 is rotated counterclockwise via the timing pulley 72, timing belt 76 and timing pulley 75, so that the first rope elements 96 of the feeding wire ropes 95 are fed by a fixed amount in the workpiece conveying direction 28 via the feeding pulleys 89, 87, 85 and 86.

3. Then, the air cylinder 60 is actuated. The operating rod of the air cylinder 60 is thus retracted so that the movable plate 61 is lowered, causing the first rope elements 96 to be brought into the feed wire grooves 33a of the hot plates 33 so that the workpiece 123 is released from the first wire ropes 96 and placed on the hot plates 33, thus being heated.

4. The feeding movement of the workpiece 123 is temporarily stopped at this point so that it is heated by the hot plate 33. During this pause period, the drive motor 71 is rotated by a fixed amount in the opposite direction from the direction of the rotation (i.e., the drive motor 71 is rotated in the clockwise direction).

5. Afterward, the operating rod of the air cylinder 60 is extended so that the movable plate 61 is raised, thus lifting the workpiece 123 above the heating block 29 by the first rope elements 96.

6. Next, the drive motor 71 is again rotated by a fixed amount in the counterclockwise direction (i.e., in the direction indicated by arrow F), and the operating rod of the air cylinder 60 is retracted so that the movable plate 61 is lowered and the workpiece 123 is placed on the next hot plate 33 so as to be heated.

With the execution of the feeding operation described above, the workpiece 123 is fed successively from the heating block 29 located closest to the workpiece entry port 17 to the heating block 29 located closest to the workpiece exit port 18, thus being heated by these heating blocks so that the paste 122 is dried.

In the above embodiment, the first and second pulley grooves 80a and 80b are formed in each of the drive pulleys 80, and the first and second rope elements 96 and 97 are respectively installed in these first and second pulley grooves 80a and 80b. Accordingly, the two rope elements 96 and 97 are wound on the entire circumference of each of the drive pulleys 80, and no slippage of the rope elements 96 and 97 occurs. In addition, though the drive pulleys 80 are rotated in the forward and backward directions many times quickly during the feeding operation, no entanglement between the first and second rope elements 96 and 97 occurs, and the first rope elements 96 on which the workpieces are loaded are moved constantly by a fixed amount. In other words, since there is no fluctuation in the amount by which the first rope elements are moved, the workpieces are constantly fed by a fixed amount and placed on the heating blocks 29 with high accuracy and reliability.

When the workpieces 123 are heated by the heating blocks 29, a high-temperature gas heated and supplied to the gas emitting pipes 55 by the heater-equipped gas introduction pipes 58 is blown onto the top surfaces of the workpieces 123. In particular, the high-temperature gas supplied to the gas introduction pipes 58 is blown into the gas supply chamber casing 5 through the gas emitting holes (not shown) formed in the gas emitting pipes 55, and this high-temperature gas flows in a laminar flow through the gas supply slits 45, being uniformly blown onto the surfaces of the workpieces 123.

The high-temperature gas blown onto the workpieces 123 and any harmful gases evolved therefrom can pass through the gaps 30 between the heating blocks 29 and the elongated slots 26a formed in the heating block supporting plate 26, and then go into the space 27, so that they are discharged to the outside of the casing 3 through the gas discharge pipes 37.

It is possible to design the present invention so that the hot plates 33 provided on the heating blocks 29 are heated at a higher temperature from the blocks near the workpiece entry port 17 to the blocks near the workpiece exit port 18 as disclosed in Japanese Utility Model Application Publication (Kokoku) No. 6-19546. In other words, the respective heating blocks 29 can be separately temperature-controlled. For example, the first three heating blocks 29 from the workpiece entry port 17 are heated at 250° C., the two next heating blocks 29 are heated at 270° C., and then the remaining three heating blocks 29 are controlled to 250° C.

All the surfaces of the heating block main body 32 of each heating block 29 (except for the upper surface of the heating block main body 32) are covered by adiabatic plates 34, 35 and 36. Accordingly, there is no mutual thermal interaction between adjacent heating blocks 29. Thus, the temperature of each heating block 29 can be accurately controlled, and this control is easily accomplished.

Furthermore, in the embodiment above, the gas supply chamber casing 5 is openable with respect to the workpiece heating chamber casing 4. Accordingly, in cases where workpieces 123 are mis-conveyed (e.g., in cases where the workpieces are obliquely positioned on the wire ropes 95), or where wire rope breakage has occurred, or furthermore where soiled wire ropes 95 or heating blocks 29 are to be cleaned, etc., the gas supply chamber casing 5 is opened by lifting the handle 21, thus creating an access to the inside of the workpiece heating chamber casing 4 and fixing the problems described above. When the casing 5 is opened, the heating blocks 29 and the wire ropes 95 of the workpiece conveying means are exposed, and mis-conveyed workpieces 123 can easily be removed or placed orderly, the broken wire ropes 95 can be replaced, and the wire ropes 95 and the surfaces of the heating blocks 29, etc. can be cleaned efficiently in a short period of time, thus maintaining high productivity.

In the embodiment described above, the casing is divided into two portions: a workpiece heating chamber casing which contains therein a plurality of heating blocks, and a gas supply chamber casing which supplies high temperature gas onto the heating blocks; and the gas supply chamber casing is installed so as to be opened and closed relative to the workpiece heating chamber casing. However, the present invention can be applied to a box-type casing which contains both heating blocks and gas supply components therein.

As seen from the above, according to the present invention, a curing apparatus includes a plurality of heating blocks which are installed with gaps in between in the conveying direction of workpieces, and the lower surface, both side surfaces oriented in the workpiece conveying direction and both end surfaces oriented perpendicular to the workpiece conveying direction of the heating block main body of each of the heating blocks are covered with heat-insulating plates. Accordingly, the temperature of each of the heating blocks can be accurately and easily controlled.

I claim:

1. A curing apparatus equipped with a plurality of separate heating blocks which are installed, with gaps between each of said plurality of separate heating blocks, in a conveying direction of workpieces in which chips are bonded to lead frames by a paste and which are used to heat said workplaces, said curing apparatus being characterized in that heat-insulating plates are fastened to a lower surface, both side surfaces oriented in said conveying direction of said workplaces and both end surfaces oriented perpendicular to said conveying direction of said workplaces of a main body of each of said plurality of separate heating blocks whereby a temperature of each of said plurality of separate heating blocks can be controlled more accurately and easily.

2. A curing apparatus according to claim 1, wherein a hot plate is fastened to an upper surface of said main body of each of said plurality of separate heating blocks.

3. A curing apparatus equipped with a plurality of heating blocks which are spacedly installed in a conveying direction of workpieces on which a past has been applied in order to bond elements on said workpieces, said curing apparatus being characterized in that each of said plurality of heating blocks is separately covered with heat-insulating plates except for an upper top surface thereof.

* * * * *